(12) United States Patent
Keller et al.

(10) Patent No.: US 7,476,588 B2
(45) Date of Patent: Jan. 13, 2009

(54) METHODS OF FORMING NAND CELL UNITS WITH STRING GATES OF VARIOUS WIDTHS

(75) Inventors: David J. Keller, Boise, ID (US); Hongbin Zhu, Boise, ID (US); Alex J. Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/652,903

(22) Filed: Jan. 12, 2007

(65) Prior Publication Data

US 2008/0169496 A1    Jul. 17, 2008

(51) Int. Cl.
*H01L 21/336* (2006.01)
*H01L 21/311* (2006.01)
*H01L 21/302* (2006.01)

(52) U.S. Cl. ............. 438/258; 438/264; 438/266; 438/700; 438/739; 257/E29.3

(58) Field of Classification Search ............ 438/258, 438/266, 739; 257/314–316, E29.3
See application file for complete search history.

(56) References Cited

U.S. PATENT DOCUMENTS

| | | | |
|---|---|---|---|
| 6,951,790 B1 | 10/2005 | Violette | |
| 7,112,488 B2 | 9/2006 | Helm et al. | |
| 7,344,942 B2 * | 3/2008 | Korber | 438/257 |
| 2005/0059262 A1 * | 3/2005 | Yin et al. | 438/780 |
| 2005/0281092 A1 | 12/2005 | Lindsay | |
| 2006/0043456 A1 | 3/2006 | Derderian et al. | |
| 2006/0226471 A1 * | 10/2006 | Lindsay et al. | 257/315 |
| 2006/0267075 A1 * | 11/2006 | Sandhu et al. | 257/316 |
| 2007/0004140 A1 * | 1/2007 | Jang et al. | 438/257 |
| 2007/0072435 A1 * | 3/2007 | Kumar | 438/743 |
| 2007/0210372 A1 * | 9/2007 | Park et al. | 257/321 |
| 2008/0003754 A1 * | 1/2008 | Jeong et al. | 438/299 |

* cited by examiner

*Primary Examiner*—Hsien-ming Lee
*Assistant Examiner*—Kevin A Parendo
(74) *Attorney, Agent, or Firm*—Wells St. John P.S.

(57) ABSTRACT

Some embodiments include methods of forming a NAND cell unit having a NAND string gate closest to a select gate with a different width than other NAND string gates more distant from the select gate. Some embodiments include utilization of an etch comprising HBr and $O_2$ to extend a pattern through a carbon-containing layer. The patterned carbon-containing layer may be used to pattern NAND cell unit gates. Some embodiments include structures having a patterned carbon-containing layer defining a NAND cell unit having a NAND string gate closest to a select gate with a different width than other NAND string gates more distant from the select gate.

23 Claims, 7 Drawing Sheets

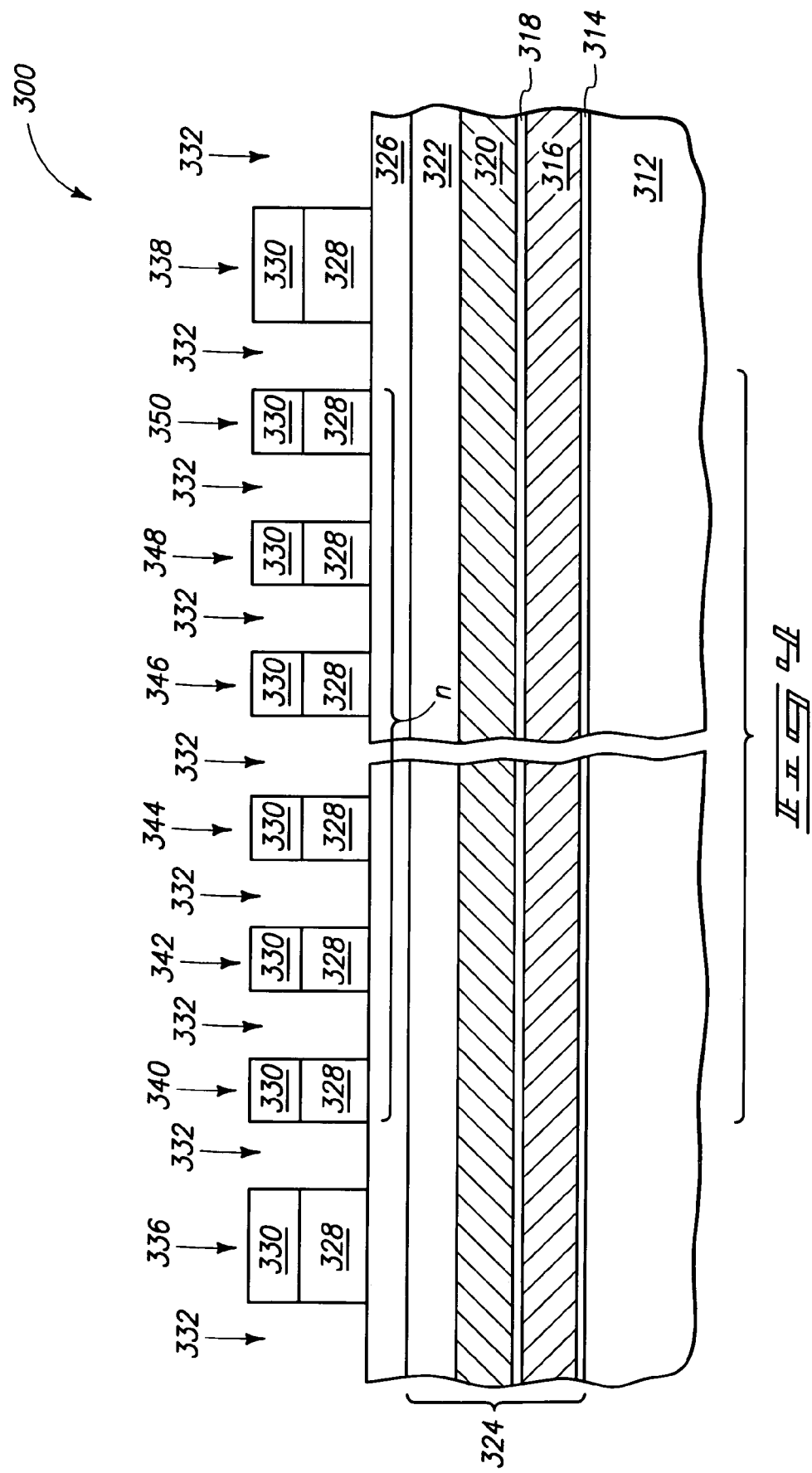

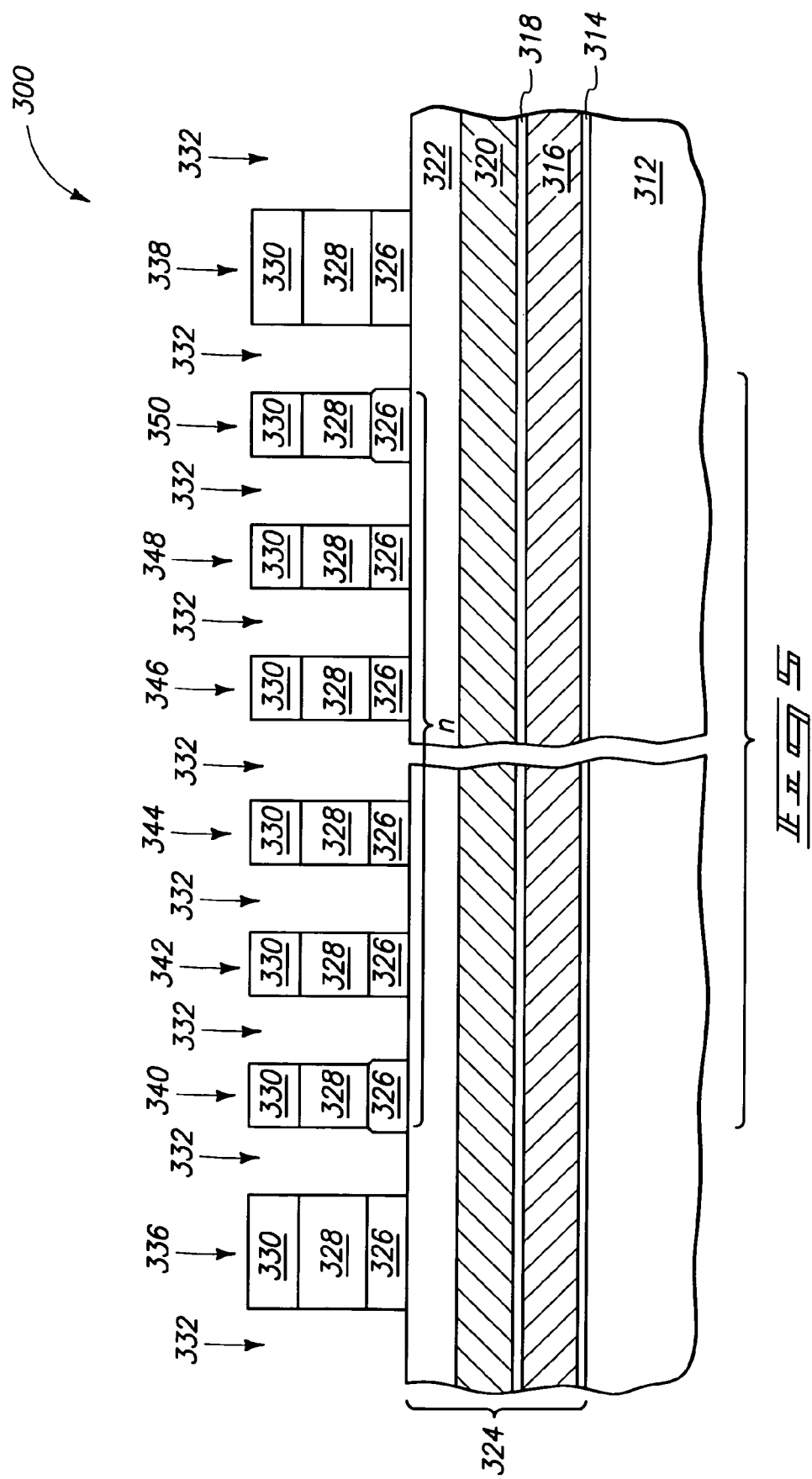

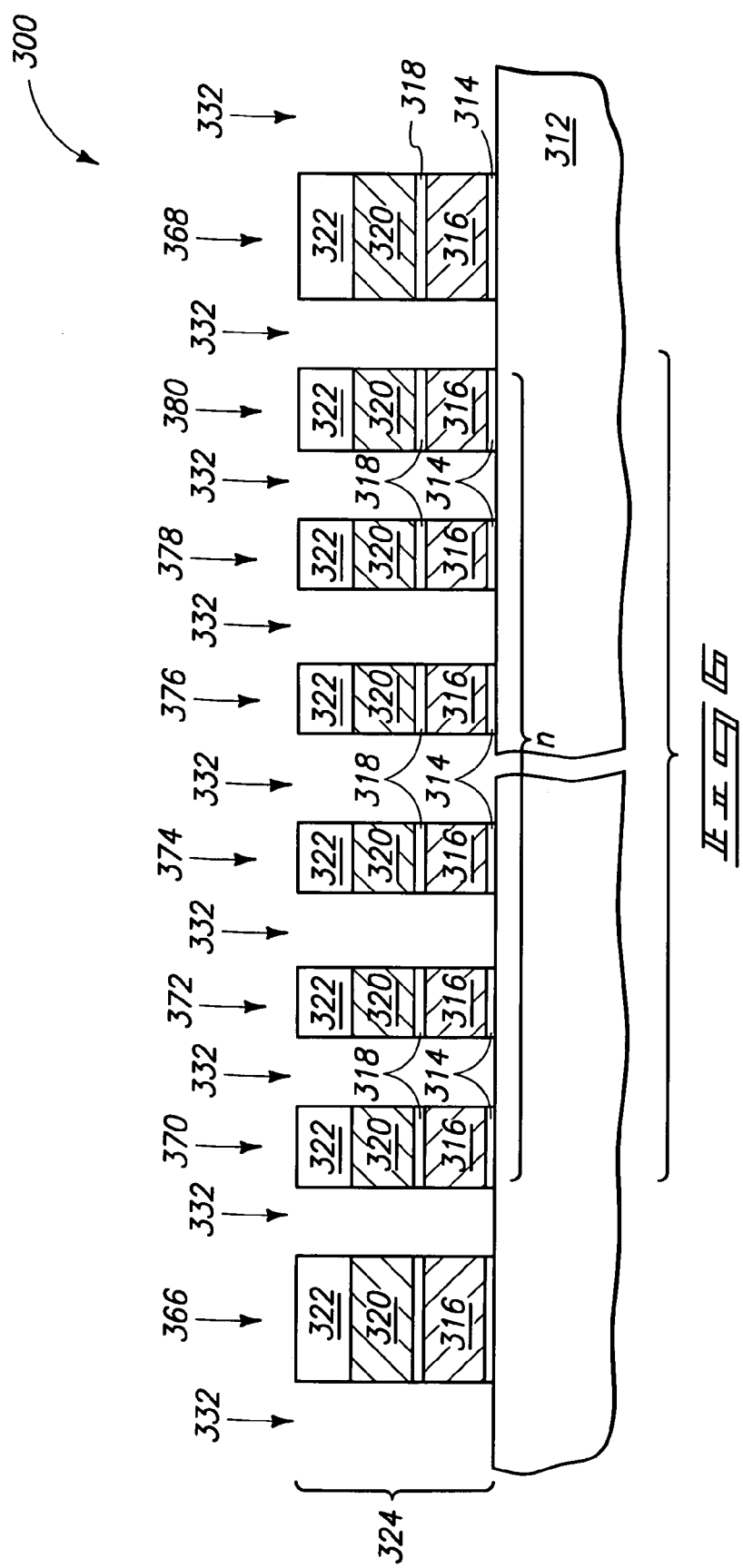

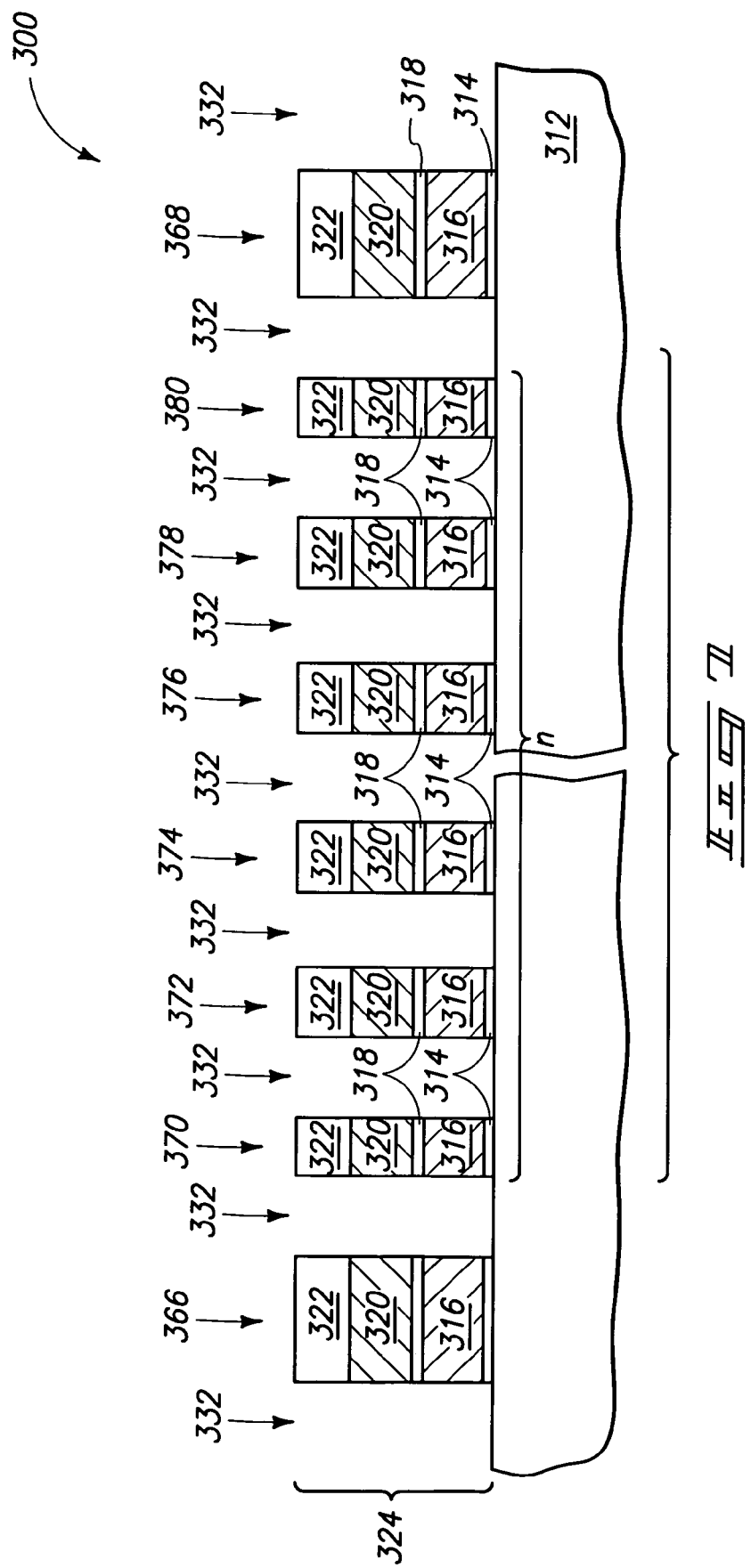

US 7,476,588 B2

METHODS OF FORMING NAND CELL UNITS WITH STRING GATES OF VARIOUS WIDTHS

TECHNICAL FIELD

NAND cells units, semiconductor constructions, and methods of forming NAND cell units.

BACKGROUND

Memory devices provide data storage for electronic systems.

One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Such a BIOS is sometimes called a flash BIOS. Flash memory is also popular in wireless electronic devices because it enables the manufacturer to support new communication protocols as they become standardized, and to provide the ability to remotely upgrade the device for enhanced features.

A typical flash memory comprises a memory array that includes a large number of memory cells arranged in row and column fashion. Each of the memory cells includes a floating gate field effect transistor capable of holding a charge. The cells are usually grouped into blocks. Each of the cells within a block may be electrically programmed by charging the floating gate. The charge may be removed from the floating gate by a block erase operation. The data in a cell is determined by the presence or absence of the charge in the floating gate.

NAND is a basic architecture of flash memory. A NAND cell unit comprises a select gate coupled in series to a serial combination of memory cells (with the serial combination being commonly referred to as a NAND string). One of the memory cells of the NAND string will be nearer the select gate than all of the other memory cells of the NAND string, and such memory cell may be referred to as a first memory cell. There may be advantages to forming the first memory cell of the NAND string to have a different dimension than other memory cells of the NAND string. A Samsung 4 GB SLC (single level cell) NAND flash utilizes a construction in which the first memory cell is wider, in at least one cross-sectional view, than other memory cells of the NAND string so that the first memory cell has a longer channel length than other memory cells of the NAND string.

BRIEF DESCRIPTION OF THE DRAWINGS

FIGS. 3-6 illustrate a semiconductor wafer fragment at various processing stages of an embodiment of the invention.

FIG. 7 illustrates a semiconductor wafer fragment at a processing stage analogous to that of FIG. 6, showing an alternative embodiment to that of FIG. 6.

DETAILED DESCRIPTION OF THE ILLUSTRATED EMBODIMENTS

Figure 1:
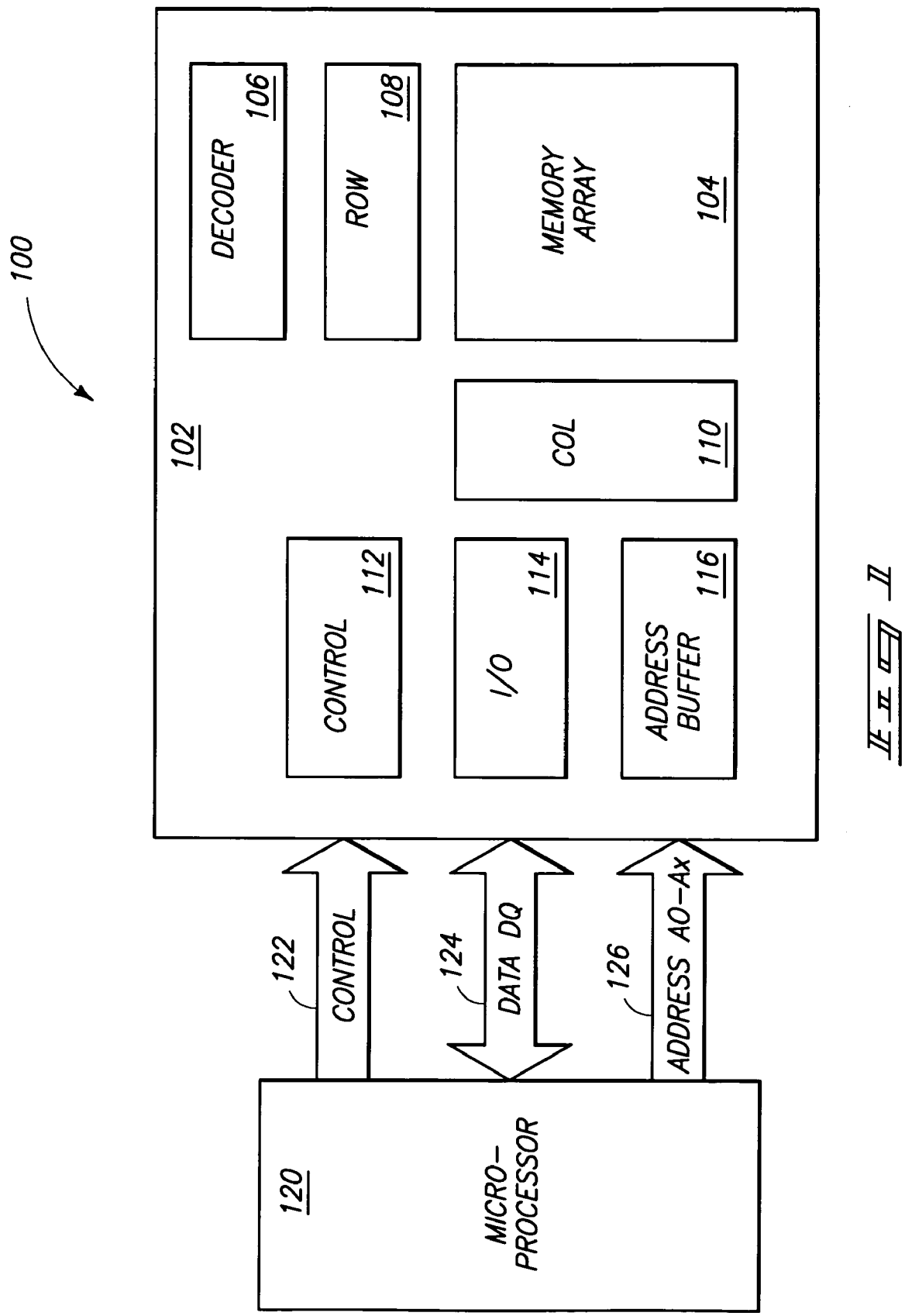
FIG. 1 is a simplified block diagram of a memory system in accordance with an embodiment of the invention.

FIG. 1 is a simplified block diagram of a memory system 100, according to an embodiment of the invention. Memory system 100 includes an integrated circuit flash memory device 102 (e.g., a NAND memory device), that includes an array of floating-gate memory cells 104, an address decoder 106, row access circuitry 108, column access circuitry 110, control circuitry 112, input/output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126, and are decoded at address decoder 106 to access the memory array 104. Address buffer circuit 116 latches the address signals. The memory cells may be accessed in response to the control signals and the address signals.

Figure 2:
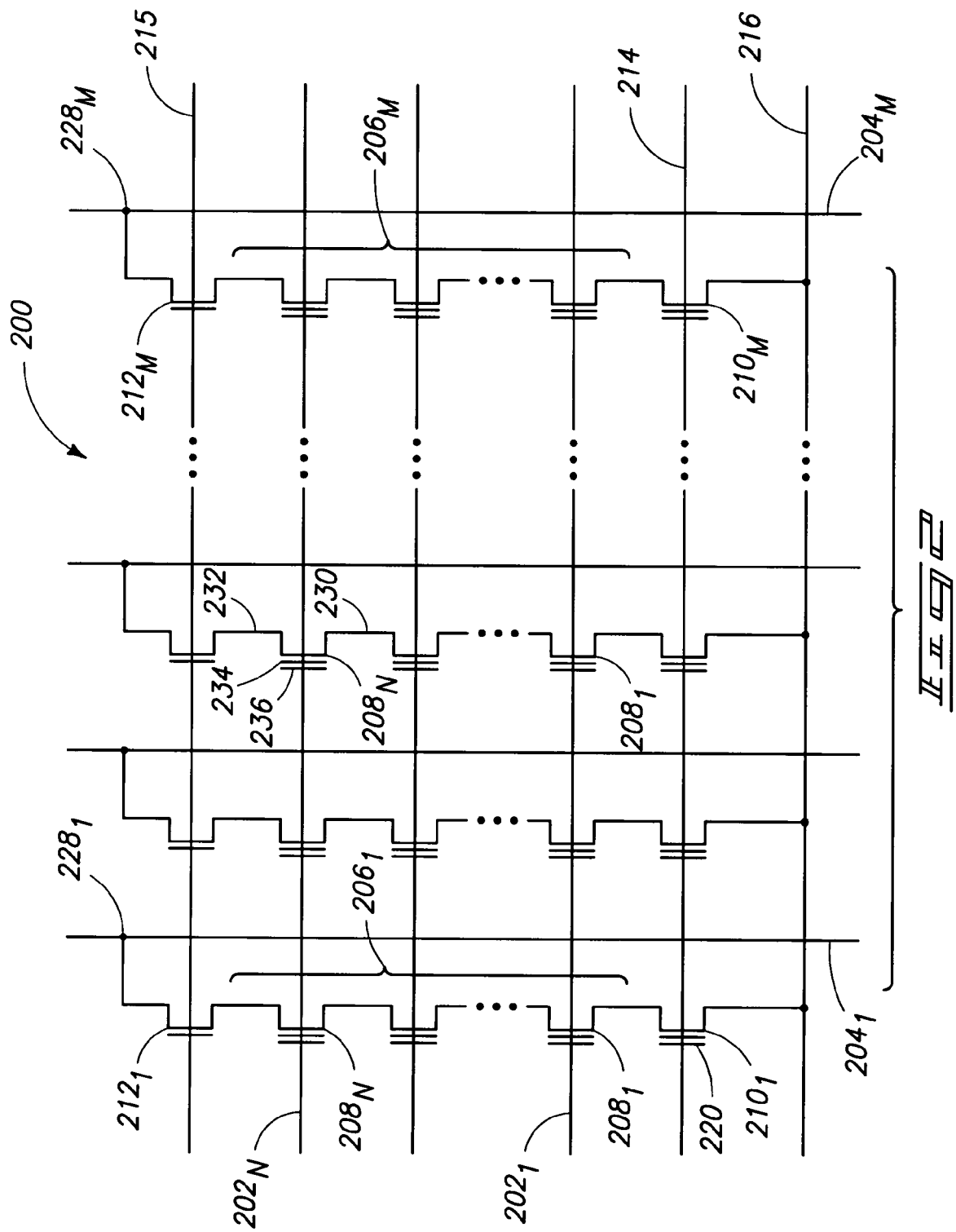
FIG. 2 is a schematic of a NAND memory array in accordance with an embodiment of the invention.

FIG. 2 is a schematic of a NAND memory array 200. Such may be a portion of memory array 104 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes floating gate transistors $208_1$ to $208_N$. The floating gate transistors are located at intersections of wordlines 202 and a local bitlines 204. The floating gate transistors 208 represent non-volatile memory cells for storage of data. The floating gate transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating gate transistor $208_N$ of the corresponding NAND string $206_1$.

Floating gate transistors 208 include a source 230 and a drain 232, a floating gate 234, and a control gate 236. Floating gate transistors 208 have their control gates 236 coupled to a wordline 202. A column of the floating gate transistors 208 are those NAND strings 206 coupled to a given local bitline 204. A row of the floating gate transistors 208 are those transistors commonly coupled to a given wordline 202.

Some embodiments of the invention pertain to new methods which may be utilized for fabricating NAND cell units in which a NAND string gate nearest a select gate is different in dimension from other NAND string gates. The select gate may be either a source select gate or a drain select gate. In some embodiments, a plurality of NAND string gates are between a source select gate and a drain select gate, and the NAND string gates closest to the source select gate and the drain select gate are of a different dimension than the remainder of the NAND string gates.

An embodiment of the invention is described with reference to FIGS. 3-6.

Figure 3:
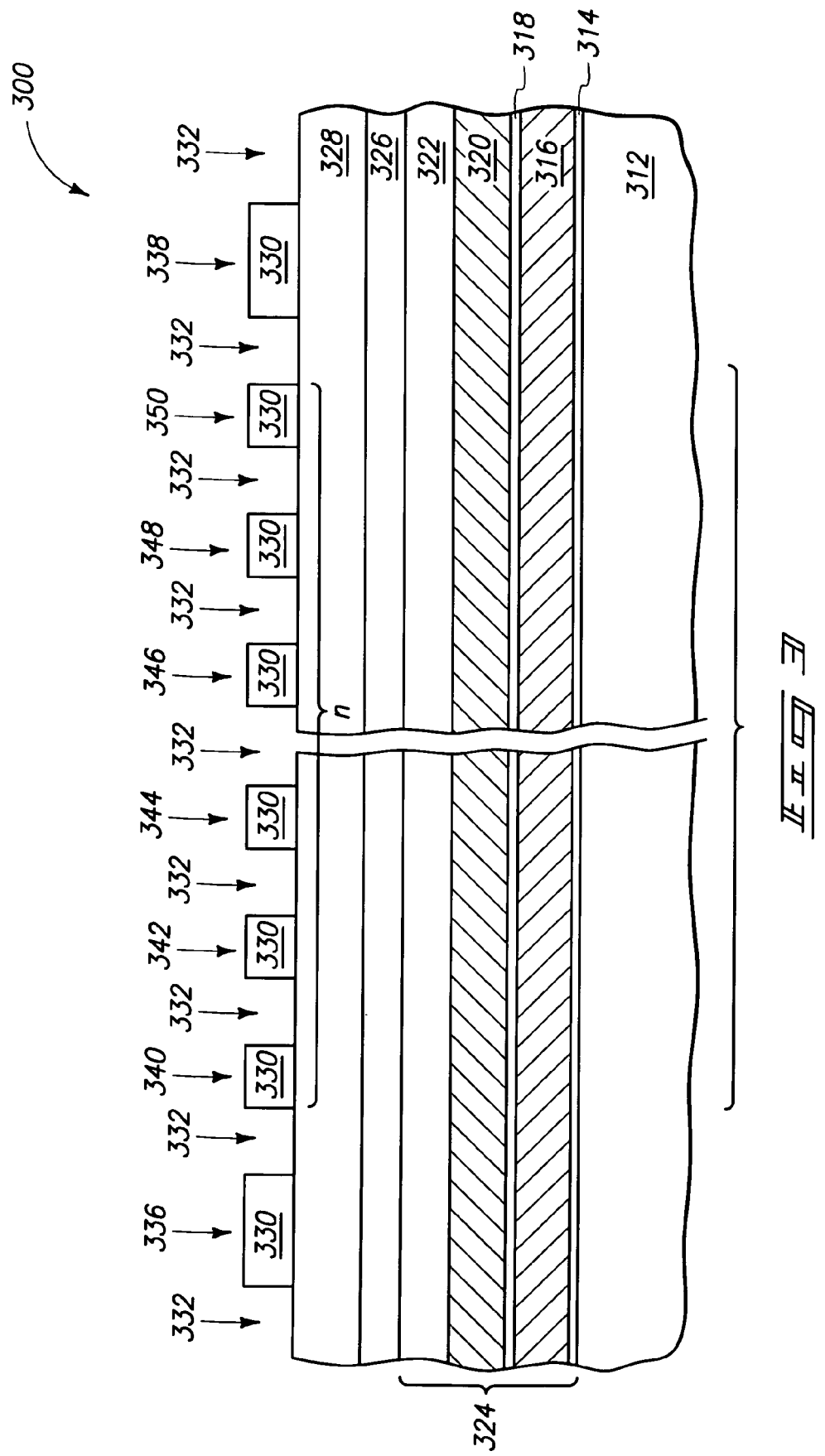

Referring to FIG. 3, a semiconductor construction 300 is illustrated at a preliminary processing stage. Construction 300 comprises a base semiconductor material 312. The base semiconductor material may comprise, consist essentially of, or consist of silicon; and may, for example, correspond to monocrystalline silicon lightly background doped with p-type dopant. Base semiconductor material 312 may be considered a semiconductor substrate or a portion of a semiconductor substrate. The terms "semiconductive substrate", "semiconductor construction" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Base semiconductor material 312 may be homogeneous, as shown, or may comprise various integrated circuit structures incorporated therein at the processing stage of FIG. 3.

Gate dielectric material 314 is formed over base 312. The gate dielectric material may comprise any suitable composition or combination of compositions, and may comprise, consist essentially of, or consist of silicon dioxide. The gate dielectric material may comprise a single layer, as shown, or may comprise multiple layers of electrically insulative material.

Electrically conductive floating gate material 316 is formed over gate dielectric material 314. Floating gate material 316 may comprise any suitable composition or combination of compositions, and may comprise, consist essentially of, or consist of one or more metals (for instance, tungsten and titanium), metal-containing compositions (for instance, metal silicides and metal nitrides), and conductively-doped semiconductor materials (for instance, conductively-doped silicon). Floating gate material 316 may be a single electrically conductive layer, as shown, or may comprise multiple electrically conductive layers.

Inter-gate dielectric material 318 is formed over electrically conductive floating gate material 316. Dielectric material 318 may comprise any suitable composition or combination of compositions, and may comprise, consist essentially of, or consist of one or both of silicon dioxide and silicon nitride. For instance, dielectric material 318 may comprise a layer of silicon nitride between a pair of layers of silicon dioxide (a so-called ONO dielectric stack); or a high-k dielectric, such as $Al_2O_3$.

Electrically conductive control gate material 320 is formed over inter-gate dielectric material 318. Control gate material 320 may comprise any suitable composition or combination of compositions, and may comprise, consist essentially of, or consist of one or more metals (for instance, tungsten and titanium), metal-containing compositions (for instance, metal silicides and metal nitrides), and conductively-doped semiconductor materials (for instance, conductively-doped silicon). Control gate material 320 may be a single electrically conductive layer, as shown, or may comprise multiple electrically conductive layers.

Electrically insulative capping material 322 is formed over control gate material 320. Capping material 322 may comprise any suitable composition or combination of compositions, and may comprise, consist essentially of, or consist of one or more of silicon dioxide, silicon nitride and silicon oxynitride. Capping material 322 may be a single electrically insulative layer, as shown, or may comprise multiple electrically insulative layers.

Materials 314, 316, 318, 320 and 322 may be together considered a flash gate stack 324, in that the materials may ultimately be patterned into flash gates.

A first masking layer 326 is formed over the flash gate stack 324. Masking layer 326 may be a carbon-containing layer, and may comprise, consist essentially of, or consist of transparent carbon. Masking layer 326 may be formed to a thickness of from about 500 Å to about 2500 Å.

A second masking layer 328 is over the first masking layer 326. Second masking layer 328 may be a silicon-containing layer, and may comprise, consist essentially of, or consist of one or both of polycrystalline silicon and amorphous silicon.

A patterned third masking layer 330 is over second masking layer 328. Third masking layer 330 may be an oxide-containing layer, and may, for example, comprise, consist essentially of, or consist of silicon oxide. Various antireflective materials (not shown) may be provided in addition to the illustrated masking layers.

Third masking layer 330 is patterned to have a plurality of openings 332 extending therethrough. The openings define remaining regions of mask 330 corresponding to a first select gate pattern 336, a second select gate pattern 338, and a plurality of string gate patterns 340, 342, 344, 346, 348 and 350 between the select gate patterns. Although only 6 string gate patterns are shown, the fragment of FIG. 3 is illustrated to be broken down the middle, and a bracket with the label "n" is utilized to indicate that there may be a large number ("n") of string gate patterns formed between the selected patterns. In other embodiments, less than 6 string gate patterns may be formed between the select gate patterns. The string gate patterns may be numerically ordered from left to right so that the string gate pattern 340 (the string gate pattern closest to select gate pattern 336) is referred to as a first string gate pattern, and the string gate pattern 350 (the string gate pattern closest to select gate pattern 338) is referred to as a last string gate pattern. The string gate patterns and select gate patterns may be considered to together define a NAND cell unit pattern.

The select gate patterns 336 and 338 are shown to be relatively wide, and the string gate patterns 340, 342, 344, 346, 348 and 350 are shown to be narrower than the select gate patterns. Further, the string gate patterns are all shown to be about the same widths as one another. The string gate patterns may, for example, all have widths of about 54 nanometers plus or minus about 4 nanometers (in other words, 54 nanometers within a tolerance of about 4 nanometers).

Masking material 330 may be patterned by forming photolithographically-patterned photoresist over a layer of material 330, transferring a pattern from the photoresist to layer 330, and subsequently removing the photoresist to leave the shown construction.

In some embodiments, construction 300 of FIG. 3 may be considered to comprise a patterned masking material 330 over a stack which includes materials 314, 316, 318, 320, 322, 326 and 328. For instance, construction 300 of FIG. 3 may be considered to comprise a patterned mask 330 over a stack which includes carbon-containing layer 322 and electrically conductive gate layer 316.

Referring to FIG. 4, openings 332 are extended through masking material 328 with a suitable etch. If material 328 consists of one or both of polycrystalline silicon and amorphous silicon, the etch may utilize HBr and $O_2$, with or without $Cl_2$.

The extension of the openings into material 328 transfers the NAND cell unit pattern into material 328.

Referring to FIG. 5, openings 332 are extended through carbon-containing material 326 with an etch utilizing sulfur dioxide ($SO_2$), oxygen ($O_2$) and hydrogen bromide (HBr).

The etching through carbon-containing material 326 forms the NAND cell unit pattern in the carbon-containing material. However, the conditions utilized for the transfer of the string gate patterns into carbon-containing material 326 cause the string gate patterns 340 and 350 within the carbon-containing material to have different dimensions than the remaining string gate patterns 342, 344, 346 and 348. String gate patterns 340 and 350 are the string gate patterns closest to the select gate patterns 336 and 338, and in the shown embodiment are wider than the remaining string gate patterns. The difference in width of string gate patterns 340 and 350 relative to the remaining string gate patterns is outside of a margin of tolerance of the etching process. For instance, if string gate patterns 342, 344, 346 and 348 have widths within about 4 nanometers of one another, the string gate patterns 340 and 350 have widths that differ from the widths of the remaining string patterns by more than such 4 nanometer margin of tolerance.

The etching into carbon-containing material 326 may utilize an etchant comprising sulfur dioxide, $O_2$ and hydrogen bromide in a ratio $SO_2$:$O_2$:HBr of about 90-140:50-90:50-160; and in some embodiments such ratio may be about 1.5:1:1.6. For instance, the etching may use the following conditions:

a flow of HBr into a reaction chamber of from about 50 standard cubic centimeters per minute (sccm) to about 160 sccm (for instance, about 120 sccm);

a flow of sulfur dioxide into the reaction chamber of from about 90 sccm to about 140 sccm (for instance, about 110 sccm);

a flow of $O_2$ into the reaction chamber of from about 50 sccm to about 90 sccm (for instance, about 75 sccm);

a pressure within the chamber of from about 5 millitorr to about 20 millitorr;

a plasma power of from about 400 watts to about 900 watts;

a bias on the substrate within the chamber of about 150-550 volts; and a temperature within the chamber of about 33° C.

The etching conditions may be maintained for a time of from about 30 seconds to about 1 minute.

An alternate etch to that described above may use the following conditions:

a flow of HBr into a reaction chamber of from about 20 standard cubic centimeters per minute (sccm) to about 120 sccm;

a flow of sulfur dioxide into the reaction chamber of from about 40 sccm to about 60 sccm;

a flow of $O_2$ into the reaction chamber of from about 20 sccm to about 40 sccm;

a pressure within the chamber of from about 5 millitorr to about 20 millitorr; and a bias on the substrate within the chamber of from about 150 watts to about 250 volts.

The etchant utilized for etching into carbon-containing material 326 may consist of sulfur dioxide, hydrogen bromide and oxygen in some embodiments. In other embodiments, the etchant may utilize other compositions. For instance, in some embodiments the etchant may utilize HBr, $O_2$, and $N_2$, without $SO_2$.

The aggressiveness of the etching into carbon-containing layer 326 with the HBr, $SO_2$ and $O_2$ may be altered by changing the relative amount of oxygen. For instance, increasing the relative amount of oxygen may make the etch more aggressive, and decreasing the relative amount of oxygen may make the etch less aggressive.

Although the string gate patterns closest to the select gate patterns are shown having larger widths than the remaining string gate patterns, the etch may be adjusted so that the string gate patterns closest to the select gate patterns have smaller widths than the remaining string gate patterns. More aggressive etches may decrease widths of the string gate patterns closest to the select gate patterns faster than the widths of other string gate patterns, while less aggressive etches may decrease widths of string gate patterns closest to the select gate patterns slower than the widths of the other string gate patterns.

Referring to FIG. 6, openings 332 are extended through the gate stack 324. Such patterns NAND select gates 366 and 368 from the select gate patterns 336 and 338 (FIG. 5), and patterns NAND string gates 370, 372, 374, 376, 378 and 380 from the string gate patterns 340, 342, 344, 346, 348 and 350, respectively.

Masking materials 326, 328 and 330 (FIG. 5) are removed to form the construction of FIG. 6. The etching through gate stack 324 may comprise multiple etches to etch through the various components of the gate stack, and some of such etches may remove some of the masking materials. For instance, capping layer 322 of the gate stack may comprise silicon dioxide, and the etch through such capping layer may remove silicon dioxide-containing masking layer 330. Similarly, one or both of gate layers 316 and 320 may comprise silicon, and the etch through the silicon-containing gate layer may remove silicon-containing masking material 328. Subsequently, the carbon-containing masking material 326 may be removed with a so-called oxygen strip (in other words, an etch utilizing oxygen to oxidize the carbon-containing masking material). In some embodiments, materials 328 and 330 may be removed from over material 326 prior to etching into the gate stack. For instance, if an aggressive etch is utilized to reduce a width of the regions of material 326 corresponding to the first and last NAND string gate patterns more than widths of patterned materials overlying such first and last NAND string gate patterns, materials 328 and 330 may be removed from over material 326 prior to etching into the gate stack.

The first and last NAND string gates 370 and 380 have dimensions which differ from the dimensions of the other NAND string gates 372, 374, 376 and 378 by at least the amount by which the dimensions of the NAND string patterns 340 and 350 in the carbon-containing layer (FIG. 5) differed from the dimensions of the remaining NAND string patterns 342, 344, 346 and 348. For instance, the NAND string gates 372, 374, 376 and 378 may have widths of about 54 nanometers plus or minus 4 nanometers, and the first and last NAND string gates may have widths which differ from the widths of the remaining NAND string gates by more than 4 nanometers.

Although the first and last NAND string gates 370 and 380 have about the same width as one another in the shown embodiment, in other embodiments the first and last NAND string gates may have widths which differ from one another by more than a margin of tolerance of the etch utilized to etch the carbon-containing layer 326 (FIG. 5). Such other embodiments may include, for example, embodiments in which the select gates 366 and 368 are formed to have different widths from one another.

The select gates 366 and 368 may be a source select gate and a drain select gate, respectively, and may have widths of about 260 nanometers.

The NAND construction of FIG. 6 has two select gates 366 and 368, and has two string gates 370 and 380 modified in dimension relative to the remaining string gates. A NAND cell unit may, however, be understood to comprise at least one select gate, and some embodiments of the invention may be understood to form at least one string gate modified in dimension relative to other string gates.

FIG. 6 shows an embodiment in which the NAND string gates closest to the select gates are larger in width than the remaining NAND string gates, and accordingly have longer channel lengths than the remaining NAND string gates. However, as discussed above with reference to the etch through the carbon-containing layer 326, the aggressiveness of such etch may be chosen so that the NAND string gates closest to the select gates are smaller in width than the remaining NAND string gates (and accordingly have shorter channel lengths than the remaining NAND string gates). FIG. 7 illustrates an embodiment in which the NAND string gates closest to the select gates have widths smaller than the remaining NAND string gates. The numbering utilized in FIG. 7 is identical to that utilized in FIG. 6. An amount by which the NAND string gates closest to the select gates are narrower than the other NAND string gates may be more than a margin of tolerance of the widths of the NAND string gates, and may, for example, be more than 4 nanometers in some embodiments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a NAND cell unit, comprising:
    forming a stack of layers, the layers including a carbon-containing layer and an electrically conductive layer, with the carbon-containing layer being over the electrically conductive layer;
    forming a patterned mask over the stack of layers, the mask having openings extending therethrough defining regions corresponding to a select gate pattern and a plurality of string gate patterns, the string gate patterns being about the same width as one another; one of said string gate patterns being a first string gate pattern and being nearer said select gate pattern than others of the string gate patterns;
    etching through the openings in the mask to form the select gate pattern and string gate patterns in the carbon-containing layer, the etching causing the first string gate pattern in the carbon-containing layer to have a different width than at least some of the others of the string gate patterns; and
    transferring the select gate pattern and string gate patterns from the carbon-containing layer to the electrically conductive layer to incorporate the electrically conductive layer into a NAND cell unit comprising a select gate and string gates, the first string gate of the NAND cell unit having a different width than other string gates of the NAND cell unit.

2. The method of claim 1 wherein the etching utilizes $O_2$ and hydrogen bromide.

3. The method of claim 2 wherein:
    the forming the stack of layers further comprises forming a layer of gate dielectric, forming the electrically conductive layer over the layer of gate dielectric, and forming an electrically insulative capping layer over the electrically conductive layer; and
    the transferring the select gate and string patterns comprises transferring the select gate and string patterns to the layer of gate dielectric and the electrically insulative capping layer.

4. The method of claim 2 wherein:
    the forming the stack of layers further comprises forming a layer of gate dielectric, forming the electrically conductive layer over the layer of gate dielectric, forming inter-gate dielectric over the electrically conductive layer, forming a control gate layer over the inter-gate dielectric, and forming an electrically insulative capping layer over the control gate layer; and
    the transferring the select gate and string patterns comprises transferring the select gate and string patterns to the layer of gate dielectric, the inter-gate dielectric, the control gate layer and the electrically insulative capping layer.

5. The method of claim 2 wherein the carbon-containing layer consists of transparent carbon.

6. The method of claim 1 wherein the etching utilizes $N_2$, $O_2$ and hydrogen bromide.

7. The method of claim 1 wherein the etching utilizes sulfur dioxide, $O_2$ and hydrogen bromide.

8. The method of claim 7 wherein the etching utilizes the sulfur dioxide, $O_2$ and hydrogen bromide in a ratio of $SO_2$:$O_2$:HBr of 90-140:50-90:50-160.

9. The method of claim 7 wherein the etching utilizes the sulfur dioxide, $O_2$ and hydrogen bromide in a ratio of $SO_2$:$O_2$:HBr of about 1.5:1:1.6.

10. The method of claim 2 wherein said different width of the first string gate pattern is a smaller width than the other string gate patterns.

11. The method of claim 2 wherein said different width of the first string gate pattern is a smaller width than the other string gate patterns by more than 4 nanometers.

12. The method of claim 2 wherein said different width of the first string gate pattern is a larger width than the other string gate patterns.

13. The method of claim 2 wherein said different width of the first string gate pattern is a larger width than the other string gate patterns by more than 4 nanometers.

14. The method of claim 2 wherein:
    the select gate pattern is a first select gate pattern, and the defined regions of the patterned mask correspond to a second select gate pattern in addition to the first select gate pattern;
    the plurality of string gate patterns is between the first and second select gate patterns;
    one of the string gate patterns is a last string gate pattern and is nearer the second select gate pattern than the others of the string gate patterns;
    the etching through the openings in the mask to form the select gate pattern and string gate patterns in the carbon-containing layer forms the first and last string gate patterns to have different widths than any of the others of the string gate patterns;
    the transferring from the carbon-containing layer to the electrically conductive layer incorporates the electrically conductive layer into a NAND cell unit comprising first and second select gates, and string gates between the first and second select gates;

the first and last string gate patterns of the carbon-containing layer are transferred to the electrically conductive layer to incorporate the electrically conductive layer into first and last string gates of the NAND cell unit; and the first and last string gates of the NAND unit cell have different widths than any other string gates of the NAND cell unit.

15. The method of claim 14 wherein the first and last string gates of the NAND unit cell have about the same widths as one another.

16. A method of forming a NAND cell unit, comprising:

forming an electrically conductive gate layer over a semiconductor substrate;

forming a carbon-containing layer over the electrically conductive gate layer;

forming a patterned mask over the carbon-containing layer, the mask having openings extending therethrough defining a pattern of at least one select gate of the NAND cell unit, and defining patterns of NAND string gates of the NAND cell unit, all of said patterns of the NAND string gates being about the same dimension as one another;

etching through the openings in the mask to pattern the carbon-containing layer with an etchant comprising $O_2$ and HBr; the patterned carbon-containing layer comprising a pattern of the at least one select gate, and comprising patterns of NAND string gates; at least one of the patterns of the NAND string gates in the carbon-containing layer having a dimension which varies from the same dimension of the other NAND string gates in the carbon-containing layer by a margin outside of a tolerance of the etching; and transferring the select gate pattern and NAND string patterns from the carbon-containing layer to the electrically conductive layer.

17. A method of forming a NAND cell unit, comprising:

forming gate stack over a semiconductor substrate, the gate stack comprising, in ascending order from the substrate, a gate dielectric layer, a floating gate layer, an inter-gate dielectric layer, and a control gate layer;

forming a carbon-containing layer over the gate stack;

forming a silicon-containing layer over the carbon-containing layer;

forming a mask over the silicon-containing layer, the mask defining a NAND cell unit pattern comprising a pair of select gate patterns and a plurality of NAND string gate patterns between the select gate patterns, all of the NAND string gate patterns being about the same dimension as one another;

transferring the NAND cell unit pattern defined by the mask into the silicon-containing layer with a first etch;

transferring the NAND cell unit pattern defined by the silicon-containing layer into the carbon-containing layer with a second etch; the second etch utilizing $SO_2$, $O_2$ and HBr; the second etch forming the NAND cell unit pattern in the carbon-containing layer to have NAND string gate patterns closest to the select gate patterns to be different in width from all other NAND string patterns of the cell unit pattern by a margin outside of a tolerance of the second etching; and transferring the NAND cell unit pattern from the carbon-containing layer to the gate stack with a third etch to form select gates and a plurality of string gates of a NAND cell unit, the string gates closest to the select gates being different in width from all other string gates of the NAND cell unit by at least the amount by which the NAND string gate patterns closest to the select gate patterns in the carbon-containing layer were different in width from all of the other NAND string gate patterns of cell unit pattern in the carbon-containing layer.

18. The method of claim 16 wherein the etching to pattern the carbon-containing layer utilizes $N_2$ in the etchant with the $O_2$ and the hydrogen bromide.

19. The method of claim 16 wherein the etching to pattern the carbon-containing layer utilizes sulfur dioxide in the etchant with the $O_2$ and hydrogen bromide.

20. The method of claim 19 wherein the sulfur dioxide, $O_2$ and hydrogen bromide are present in the etchant in a ratio of $SO_2:O_2:HBr$ of 90-140:50-90:50-160.

21. The method of claim 19 wherein the sulfur dioxide, $O_2$ and hydrogen bromide are present in the etchant in a ratio of $SO_2:O_2:HBr$ of about 1.5:1:1.6.

22. The method of claim 17 wherein the sulfur dioxide, $O_2$ and hydrogen bromide of the second etch are present in a ratio of $SO_2:O_2:HBr$ of 90-140:50-90:50-160.

23. The method of claim 17 wherein the sulfur dioxide, $O_2$ and hydrogen bromide of the second etch are present in a ratio of $SO_2:O_2:HBr$ of about 1.5:1 :1.6.

* * * * *